United States Patent
Baccouch et al.

(10) Patent No.: US 11,914,475 B2
(45) Date of Patent: Feb. 27, 2024

(54) ERASURE RECOVERY IN A DISTRIBUTED STORAGE SYSTEM

(71) Applicant: INSTITUT MINES-TELECOM, Palaiseau (FR)

(72) Inventors: Hana Baccouch, Courbevoie (FR); Nadia Boukhatem, Paris (FR)

(73) Assignee: INSTITUT MINES TELECOM, Palaiseau (FR)

( * ) Notice: Subject to any disclaimer, the term of this patent is extended or adjusted under 35 U.S.C. 154(b) by 657 days.

(21) Appl. No.: 17/045,980

(22) PCT Filed: Apr. 10, 2019

(86) PCT No.: PCT/EP2019/059119
§ 371 (c)(1),
(2) Date: Oct. 7, 2020

(87) PCT Pub. No.: WO2019/197482
PCT Pub. Date: Oct. 17, 2019

(65) Prior Publication Data
US 2021/0173740 A1    Jun. 10, 2021

(30) Foreign Application Priority Data
Apr. 13, 2018   (FR) ...................................... 1853246

(51) Int. Cl.
*G06F 11/10*   (2006.01)
*G06F 3/06*    (2006.01)
(Continued)

(52) U.S. Cl.
CPC .......... *G06F 11/1076* (2013.01); *G06F 3/064* (2013.01); *G06F 3/067* (2013.01);
(Continued)

(58) Field of Classification Search
CPC .... G06F 11/1076; G06F 3/0619; G06F 3/064; G06F 3/0659; G06F 3/067; G06F 3/0689;
(Continued)

(56) References Cited

U.S. PATENT DOCUMENTS

| 11,652,572 B2 * | 5/2023 | Song ..................... H03M 13/05 714/776 |
| 2006/0197690 A1 | 9/2006 | Liu et al. |

(Continued)

FOREIGN PATENT DOCUMENTS

| CN | 107844272 A | 3/2018 |
| JP | 2018-507462 A | 3/2018 |
| WO | 2016/052665 A1 | 4/2016 |

OTHER PUBLICATIONS

English translation of Notice of Rejection issued in Japanese Patent Application No. 2020-555866 dated Feb. 21, 2023.
(Continued)

*Primary Examiner* — Justin R Knapp
(74) *Attorney, Agent, or Firm* — BakerHostetler

(57) ABSTRACT

A method for coding (k, r) data and a method for reconstructing data are provided. The coding method includes steps consisting in: dividing an initial datum a into k data blocks $a_i$; grouping the k data blocks into r−1 subsets $S_j$ of data blocks; generating, for each subset $S_j$, a linear function $g_j(a)$ defined as a linear combination of the data blocks assigned to said subset $S_j$; and generating r parity functions comprising a primary parity function $f_0(a)$ as a linear combination of the k data blocks $a_i$, and r−1 secondary parity functions, each secondary parity function $f_j(a)$ being defined as the sum of the primary parity function $f_0(a)$ and of a linear function $g_j(a)$.

20 Claims, 10 Drawing Sheets

(51) Int. Cl.
*H03M 13/37* (2006.01)
*G06F 11/07* (2006.01)
*G06F 11/30* (2006.01)

(52) U.S. Cl.
CPC .......... *G06F 3/0619* (2013.01); *G06F 3/0659* (2013.01); *G06F 3/0689* (2013.01); *G06F 11/076* (2013.01); *G06F 11/3034* (2013.01); *H03M 13/373* (2013.01)

(58) Field of Classification Search
CPC .. G06F 11/076; G06F 11/3034; H03M 13/373
See application file for complete search history.

(56) References Cited

U.S. PATENT DOCUMENTS

| | | | |
|---|---|---|---|
| 2008/0126908 A1 | 5/2008 | Lin | |
| 2011/0093759 A1* | 4/2011 | Song | H03M 13/05 714/756 |
| 2011/0141141 A1 | 6/2011 | Kankainen | |
| 2013/0054549 A1 | 2/2013 | Gopalan et al. | |
| 2016/0211869 A1 | 7/2016 | Blaum et al. | |

OTHER PUBLICATIONS

Huang, et al., "Erasure Coding in Windows Azure Storage", USENIX, pp. 1-12, XP061013941, Apr. 11, 2013.
Huang, et al., "Pyramid Codes: Flexible Schemes to Trade Spaces for Access Efficiency in Reliable Data Storage systems", Proc. Sixth IEEE Interna-tional Symposium on Network Computing and Applications 2007, IEEE, pp. 79-86, XP031119281, ISBN: 978-0-7695-2922-6, Jul. 1, 2007.
Dimakis, et al., "Network coding for distributed storage systems", IEEE Transactions on Information Theory, vol. 56, No. 9, pp. 4539-4551, 2010.
Rashmi, et al.,"Optimal exact-regenerating codes for distributed storage at the MSR and MBR points via a product-matrix construction", IEEE Transactions on Information Theory, vol. 57, No. 8, pp. 5227-5239, 2011.
Duminuco, et al., "Hierarchical codes: How to make erasure codes attractive for peer-to-peer storage systems", P2P'08, 8th IEEE International Conference on Peer-to-Peer Computing, pp. 89-98, 2008.
Rashmi, et al., "A hitchhiker's guide to fast and efficient data reconstruction in erasure-coded data centers", ACM SIGCOMM Computer Communication Review, vol. 44(4), pp. 331-342, 2015.
Reed, et al., "Polynomial codes over certain finite fields", J Soc. Indust. Appl. Math., vol. 8, No. 2, Jun. 1960.

* cited by examiner

ERASURE RECOVERY IN A DISTRIBUTED STORAGE SYSTEM

CROSS-REFERENCE TO RELATED APPLICATIONS

This application is a National Stage of International patent application PCT/EP2019/059119, filed on Apr. 10, 2019, which claims priority to foreign French patent application No. FR 1853246, filed on Apr. 13, 2018, the disclosures of which are incorporated by reference in their entirety.

FIELD OF THE INVENTION

The invention lies in the general field of data storage systems and the management of failures in these systems. More particularly, the invention relates to methods and devices for coding and decoding data that make it possible to optimize the data read/write operations and to optimize the volume of data to be transferred, necessary for the repairing of a storage system following a failure.

BACKGROUND

In recent years, the volume of digital data has increased considerably, because of the use of applications such as social networks, email, file sharing, and video sharing. Thus, companies that offer online services have to manage data volumes of several tens of petabytes (1 PB=$10^{15}$ bytes). These quantities of data, which continue to increase exponentially year on year, need to be stored reliably.

Distributed storage systems (DSS) are widely used these days to provide open-ended and reliable storage solutions. These architectures, as illustrated in FIG. 1, comprise multiple storage nodes (110, 112, 114) in which data are stored in a distributed fashion. A storage node can be composed of one (112) or of a plurality of storage devices (110, 114). Each storage device of a node which comprises several thereof is itself designated as a storage node. Generally, the storage devices are storage discs. A controller (102) makes it possible to manage communications from/to the nodes, including the disc read/write operations based on requests received from a computer (106) coupled to the communication network (104).

Now, it is not uncommon for discs, devices or storage nodes to fail, and it is commonplace, for thousands of nodes, for several tens of failures on average to be reported per day. A distributed storage system has to ensure the protection of the data in the case where one or several nodes or storage devices or discs fail.

In order to ensure the reliability and the availability of the data, the standard implementations incorporate solutions based on the redundancy of the data in order to be able to retrieve the data lost in the event of failure.

There are several methods, listed hereinbelow, that make it possible to add reliability to a storage system:

Replication is one of the methods most widely used. It consists in replicating one and the same data block over several storage nodes. Generally, one and the same data block is stored in n different nodes, which makes it possible to tolerate n−1 failures. In practice, each data block is stored in three different nodes making it possible to tolerate two failures. Even though replication offers a good tolerance to failures, it has the disadvantage of posting a storage overhead, which can be assessed at 200% in replications with 3 nodes.

Erasure Code. This approach is based on the use of the well-known Reed-Solomon (RS) codes. Each data file is broken down into k data blocks to which are added r parity function blocks generating k+r data blocks, and the term code RS(k,r) is used. The k+r data blocks are stored in k+r different nodes, in which k nodes store the k original blocks and r parity nodes store the r parity function blocks. A code RS(k,r) has two basic properties: any data block k out of the k+r blocks is sufficient to regenerate the original datum, and r failures, whatever they may be, can be tolerated. In practice, with a code RS(10,4), each data file is broken down into 10 blocks, and 4 parity function blocks are generated, making it possible to tolerate up to four failures. The RS codes offer a better storage efficiency compared to replication, the storage overhead being assessed at 40% for a code RS(10,4).

In a data storage system, in case of failure, reconstructing the data entails reading the data stored in the redundancy nodes, then transferring them in the network from these nodes supplying data, also called "providers", into a new storage node, also called "newcomer". Even if, in the event of failure of a single node, there is need for only a single provider in the case of replication, k providers are required in the case of a code RS(k,r), then involving the transfer over the network of the data from the k providers. The repair of a single failure can thus entail reading and transmitting hundreds of terabytes (TB). Also, the cost of the repair in terms of bandwidth and of reads/writes can be significant.

Some solutions listed hereinbelow address reducing the bandwidth required during the repair phase, or "bandwidth repair".

Regenerating codes are one example. The main idea as described in the article "Network coding for distributed storage systems", Alexandros G Dimakis, P Brighten Godfrey, Yunnan Wu, Martin J Wainwright, and Kannan Ramchandran, IEEE Transactions on Information Theory, 56(9): 4539-4551, 2010, is that each node generates a linear combination of data from the data blocks which are available to it. The quantity of data to be transferred from each provider node is then lower than that stored in each node, which reduces the bandwidth required for the repair. However, with a regenerating code, the information retrieved in the new node is a linear combination of the transferred data, and it can then not necessarily be equal to the data block lost.

Exact regenerating codes are proposed for retrieving exactly the same lost data block. The main idea as described in the article "Optimal exact-regenerating codes for distributed storage at the MSR and MBR points via a product-matrix construction", Rashmi, Korlakai Vinayak, Nihar B. Shah, and P. Vijay Kumar, IEEE Transactions on Information Theory 57(8): 5227-5239, 2011, consists in eliminating the unwanted data blocks by using the concept of interference alignment. Even though the exact regenerating codes make it possible to considerably reduce the bandwidth for the repair, the cost of the disc inputs/outputs ("I/O overhead") is not optimized. Indeed, to repair a single failure, an exact regenerating code requires all the data stored in all the nodes to be read.

Solutions are proposed for reducing both the repair bandwidth and the cost of the disc inputs/outputs.

For example, with the hierarchical codes as presented in the article "Hierarchical codes: How to make erasure codes attractive for peer-to-peer storage systems", Alessandro Duminuco and Ernst Biersack, P2P'08, 8th IEEE International Conference on Peer-to-Peer Computing, pages 89-98, the main idea consists in hierarchically creating specific parity functions from smaller codes than the original code.

A hierarchical code (k,r) needs ⌊k/r−1⌋ (integer part of k/r−1) to k data blocks read and downloaded to repair a single failure. However, the hierarchical code does not maintain all the properties of a conventional RS code. Indeed, a hierarchical code (k,r) cannot tolerate any r failures. It therefore proves less reliable with equal redundancy.

The hitchhiker code is a code which makes it possible to maintain the same properties as an RS code and to offer a failure repair that is less costly in terms of bandwidth and of disc inputs/outputs. The main idea as described in "A hitchhikers guide to fast and efficient data reconstruction in erasure-coded data centers", KV Rashmi, Nihar B Shah, Dikang Gu, Hairong Kuang, Dhruba Borthakur, and Kannan Ramchandran, ACM SIGCOMM Computer Communication Review, 44(4):331-342, 2015, consists in reducing the number of data blocks needed to repair a single failure. The hitchhiker approach considers two RS subcodes having the same configuration (k,r). Specific parity functions which depend on the second code and on the first code are created in the second RS subcode. These interleaved parity functions make it possible to reduce the quantity of data read and transferred to repair a data block. A hitchhiker code (10,4) makes it possible to reduce by 30% to 35% the cost of the repair bandwidth and of the disc inputs/outputs.

The following references propose data coding methods for reducing the bandwidth:

Cheng Huang et al.: "Erasure Coding in Windows Azure Storage", USENIX, 11 Apr. 2013 (2013-04-11), pages 1-12, XP061013941. This LRC (k, l, r) method is based on the generation of local parity functions stored in storage nodes; however, the LRC codes introduce a storage overhead due to the additional storage of the local parity functions.

Cheng Huang et al.: "Pyramid Codes: Flexible Schemes to Trade Spaces for Access Efficiency in Reliable Data Storage systems", Proc. Sjxth IEEE International Symposium on Network Computing and Applications 2007, IEEE, 1 Jul. 2007 (2007-01-07), pages 79-86, XP031119281, ISBN: 978-0-7695-2922-6. This method presents an alternative to the LRC method. However, the pyramid codes, like the LRC codes, introduce a storage overhead compared to a conventional erasure code and to the Babylon code.

These approaches do not allow for the same storage efficiency as a conventional erasure code, contrary to the hitchhiker codes, to the regenerating codes and to the hierarchical codes, which make it possible to reduce the bandwidth while maintaining the same storage efficiency as a conventional erasure code.

Contrary to the methods described previously based on the definition of a new erasure code, the solution proposed in the patent application US 2016/211869 A1 by Blaum Mario et al. proposes a dynamic storage system incorporating several erasure codes, capable of switching between different codes as a function of the objective. The system decides either to reduce the repair bandwidth, or to reduce the storage overhead as a function of the popularity of the file. The system supports in particular the two codes: LRC (cited previously) and "Product Code" (PC).

It emerges that there is a need for a data coding/decoding solution for reconstructing data lost or damaged in the event of a failure of one or more data storage elements, which is enhanced in terms of repair bandwidth cost and of disc input/output cost, while maintaining the same storage efficiency as the conventional erasure codes.

Moreover, with the advent of SSD (Solid State Drive) discs, the storage elements are increasingly faster, and each disc can generate several tens of Gigabits per second in read mode. The bit rate of the interfaces linking the storage elements is then particularly critical and becomes a bottleneck in the storage systems. Reducing the flows to be exchanged in the event of reconstruction is therefore particularly important. There is thus the need for a solution that makes it possible to optimize the quantity of data to be transferred when repairing a storage system, following a failure.

SUMMARY OF THE INVENTION

The present invention addresses the abovementioned various needs.

The present invention aims to mitigate the limitations of the known techniques by proposing methods and devices for coding and decoding data that make it possible to optimize the quantity of data transferred, as well as the read/write operations needed for the repair of a storage system, following a failure.

Advantageously, the present invention makes it possible to reduce both the repair bandwidth and the disc input/output costs while maintaining properties of storage efficiency and of reliability in which all the failures r out of k+r are tolerated.

One object of the present invention relates to a data coding method. In particular, it proposes a method for coding (k, r) data comprising steps consisting in:
  dividing an initial datum a into k data blocks $a_i$;
  grouping the k data blocks into r−1 subsets $S_j$ of data blocks;
  generating, for each subset $S_j$, a linear function $g_j(a)$ defined as a linear combination of the data blocks assigned to said subset $S_j$, and
  generating r parity functions comprising a primary parity function $f_0(a)$ as a linear combination of the k data blocks $a_i$, and r−1 secondary parity functions, each secondary parity function $f_j(a)$ being defined as the sum of the primary parity function $f_0(a)$ and of a linear function $g_j(a)$.

Solutions are proposed for reducing both the repair bandwidth and the disc input/output cost.

For example, with the hierarchical codes as presented in the article "Hierarchical codes: How to make erasure codes attractive for peer-to-peer storage systems", Alessandro Duminuco and Ernst Biersack, P2P'08, 8th IEEE International Conference on Peer-to-Peer Computing, pages 89-98, the main idea consists in hierarchically creating specific parity functions from smaller codes than the original code. A hierarchical code (k,r) needs ⌊k/r−1⌋ (integer part of k/r−1) to k data blocks read and downloaded to repair a single failure. However, the hierarchical code does not maintain all the properties of a conventional RS code. Indeed, a hierarchical code (k,r) cannot tolerate any r failures. It therefore proves less reliable with equal redundancy.

The hitchhiker code is a code which makes it possible to maintain the same properties as an RS code and to offer a failure repair that is less costly in terms of bandwidth and of disc inputs/outputs. The main idea as described in "A hitchhikers guide to fast and efficient data reconstruction in erasure-coded data centers", KV Rashmi, Nihar B Shah, Dikang Gu, Hairong Kuang, Dhruba Borthakur, and Kannan Ramchandran, ACM SIGCOMM Computer Communication Review, 44(4):331-342, 2015, consists in reducing the number of data blocks needed to repair a single failure. The hitchhiker approach considers two RS subcodes having the same configuration (k,r). Specific parity functions which depend on the second code and on the first code are created in the second RS subcode. These interleaved parity functions make it possible to reduce the quantity of data read and transferred to repair a data block. A hitchhiker code (10,4) makes it possible to reduce by 30% to 35% the cost of the repair bandwidth and of the disc inputs/outputs.

The following references propose data coding methods for reducing the bandwidth:

Cheng Huang et al.: "Erasure Coding in Windows Azure Storage", USENIX, 11 Apr. 2013 (2013-04-11), pages 1-12, XP061013941. This LRC (k, l, r) method is based on the generation of local parity functions stored in storage nodes; however, the LRC codes introduce a storage overhead due to the additional storage of the local parity functions.

Cheng Huang et al.: "Pyramid Codes: Flexible Schemes to Trade Spaces for Access Efficiency in Reliable Data Storage systems", Proc. Sjxth IEEE International Symposium on Network Computing and Applications 2007, IEEE, 1 Jul. 2007 (2007-01-07), pages 79-86, XP031119281, ISBN: 978-0-7695-2922-6. This method presents an alternative to the LRC method. However, the pyramid codes, like the LRC codes, introduce a storage overhead compared to a conventional erasure code and to the Babylon code.

These approaches do not allow for the same storage efficiency as a conventional erasure code, contrary to the hitchhiker codes, to the regenerating codes and to the hierarchical codes, which make it possible to reduce the bandwidth while maintaining the same storage efficiency as a conventional erasure code.

Contrary to the methods described previously based on the definition of a new erasure code, the solution proposed in the patent application US 2016/211869 A1 by Blaum Mario et al. proposes a dynamic storage system incorporating several erasure codes, capable of switching between different codes as a function of the objective. The system decides either to reduce the repair bandwidth, or to reduce the storage overhead as a function of the popularity of the file. The system supports in particular the two codes: LRC (cited previously) and "Product Code" (PC).

It emerges that there is a need for a data coding/decoding solution for reconstructing data lost or damaged in the event of a failure of one or more data storage elements, which is enhanced in terms of repair bandwidth costs and of disc input/output cost, while maintaining the same storage efficiency as the conventional erasure codes.

According to alternative or combined embodiments of the coding method:

the step of generating r parity functions consists in generating r encoding vectors comprising:
a primary encoding vector $C_0$ composed of k primary encoding coefficients $c_{0,1}$ to $c_{0,k}$; and
r-1 secondary encoding vectors $C_j$ ($1 \leq j \leq r-1$), each secondary encoding vector being composed of k secondary encoding coefficients $c_{j,1}$ to $c_{j,k}$;
each primary encoding coefficient $c_{0,i}$ corresponds to a non-zero random number, and a secondary encoding coefficient $c_{j,i}$ corresponds to a non-zero or zero random number depending on whether the data block $a_i$ belongs to or does not belong to the subset $S_j$;
the step of generating a linear function $g_j(a)$ consists in generating a linear combination of the k data blocks $(a_1, \ldots, a_k)$ and of the secondary encoding vector $C_j$;
k=10 and r=4.

The data coding method of the present invention is particularly suited for distributing data over storage devices for the purpose of reconstructing data lost following a failure of a storage device. Also claimed is a method for storing k+r data comprising at least one step consisting in storing, in k systematic storage devices $N_i$, $i \in \{1, \ldots, k\}$, k data blocks $a_i$, and in storing, in r parity storage devices $N_i$, $i \in \{k+1, k+r\}$, r parity functions, the r parity functions being obtained according to the data coding method claimed.

The invention covers also a data coding device comprising means for implementing the steps of the data coding method as claimed.

Another object of the present invention relates to a method for reconstructing or duplicating the content of a device which stores data coded according to the coding method claimed. In particular, a method is claimed for reconstructing the content of a storage device out of a plurality of storage devices storing k data blocks as in k systematic storage devices $N_i$, $i \in \{1, \ldots, k\}$, and r parity functions $f_j(a)$ in r parity storage devices $N_i$, $i \in \{k+1, \ldots, k+r\}$, said k data blocks and r parity functions being obtained according to the data cooling method claimed, the reconstruction method comprising at least steps consisting in:

determining whether the storage device for which to reconstruct the content is a systematic or parity storage device;

if said device is a systematic storage device $N_i$, $i \in \{1, \ldots, k\}$:
determining to which subset of data $S_j$ the data block of said device belongs;
retrieving the primary and secondary parity functions stored in the parity storage devices k+1 and k+1+j;
computing the linear function $g_j(a)$ associated with the subset $S_j$;
retrieving the data blocks of the subset $S_j$ except for the block $a_i$; and
reconstructing the content of said systematic storage device $N_i$, $i \in \{1, \ldots, k\}$;

if said device is a parity storage device $N_i$, $i \in \{k+1, \ldots, k+r\}$, determining the index i identifying said storage device;

if the index i is equal to k+1:
retrieving the secondary parity function $f_1(a)$ stored in the parity storage device of index i=k+2 and the data blocks $a_i$ of the subset $S_1$;
computing the linear function $g_1(a)$ associated with the subset $S_1$ and decoding the primary parity function $f_0(a)$; and
reconstructing the content of said parity device of index i=k+1;

if the index i is greater than k+1:
retrieving the primary parity function $f_0(a)$ stored in the parity storage device of index i=k+1 and the data blocks $a_i$ of the subset $S_{i-k+1}$;
computing the linear function $g_{i-k+1}(a)$ associated with the subset $S_{i-k+1}$ and decoding the secondary parity function $f_{i-k+1}(a)$; and
reconstructing the content of said parity device of index i>k+1.

The content reconstruction method is particularly suited to the reconstruction of content for data lost following a failure of a storage device.

According to alternative or combined embodiments of the reconstruction method:

the steps of retrieving the parity functions consist in transferring the data from the corresponding storage devices to a data collecting device;

the step of computing the linear function $g_j(a)$, associated with the subset $S_j$ for the reconstruction of a systematic node i such that $i \in \{1, \ldots, k\}$, consists in subtracting the primary parity function stored in the storage device $N_{k+1}$ from the secondary parity function stored in the storage device $N_{k+1+j}$;

the step of computing the linear function $g_1(a)$, associated with the subset $S_1$ for the reconstruction of a parity node i such that i=k+1, consists in generating a linear combination from the data blocks of the subset $S_1$ and from the encoding vector $C_1$;

the step of computing the linear function $g_j(a)$, associated with the subset $S_j$ for the reconstruction of a parity node i such that i∈{k+2, . . . , k+r}, consists in generating a linear combination from the data blocks of the subset $S_j$ and from the encoding vector $C_j$;

the step of reconstructing the content of said systematic storage device consists in decoding the data block $a_i$ from the linear function $g_j(a)$;

the step of reconstructing the content of said parity storage device i such that i=k+1 consists in decoding the secondary parity function of said parity device of index i=k+1 from the computed linear function $g_1(a)$;

the step of reconstructing the content of said parity storage device i such that i>k+1 consists in decoding the secondary parity function of said parity device of index i>k+1 from the computed linear function $g_{i-k+1}(a)$.

The invention also covers a device for reconstructing the content of a storage device out of a plurality of devices storing k data blocks as in k systematic storage devices $N_i$, i∈{1, . . . , k}, and r parity functions $f_i(a)$ in r parity storage devices $N_i$, i∈{k+1, . . . , k+r}, said k data blocks and r parity functions being obtained according to the coding method claimed, the device comprising means for implementing the steps of the claimed method for reconstructing the content of a storage device.

The present invention can be incorporated in hardware and/or software elements such as an integrated circuit of ASIC or FPGA type.

The invention relates also to a computer program which comprises coding instructions making it possible to perform the steps of the coding method claimed and/or comprising code instructions making it possible to perform the steps of the content reconstruction method claimed, when said program is run on a computer.

The invention can be available on a storage medium that can be read by a processor on which is stored a program comprising code instructions for executing the coding method and/or the content reconstruction method as claimed.

One advantageous use of the content reconstruction method claimed is in a distributed storage system which comprises a plurality of data storage nodes capable of storing data coded according to the coding method claimed.

Another advantageous use of the content reconstruction method claimed is in a local storage system which comprises data storage discs capable of storing data coded according to the coding method claimed.

BRIEF DESCRIPTION OF THE DRAWINGS

Different aspects and advantages of the invention will emerge with the support of the description of a preferred but nonlimiting implementation of the invention, with reference to the figures below.

DETAILED DESCRIPTION

Figure 1:
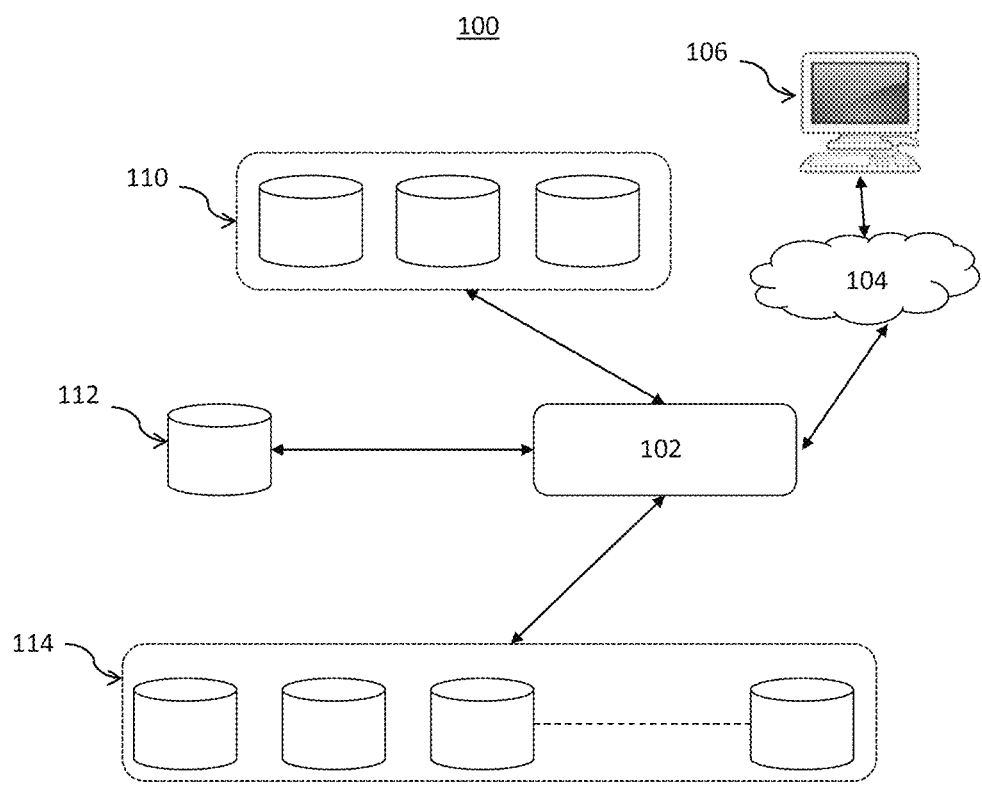
FIG. 1 illustrates a distributed system environment that makes it possible to implement the invention in an embodiment.

Throughout the rest of the description, the expression 'storage node' is used in the generic sense and denotes a storage entity, whether it be a single disc or a group of storage devices forming a node. The embodiments of the invention described apply to any variant of a distributed storage system illustrated in FIG. 1, which is only an example of an environment that makes it possible to implement the invention. Thus, this example is not limiting and the principles described can be applied for any other environment incorporating a storage system, distributed or not, such as cloud systems, data centres, distributed file systems, whether based on files or on objects. The invention can also be applied to non-distributed storage systems such as "disk arrays". Moreover, a storage node which stores data derived from the initial datum is designated "systematic node" and a storage node which stores a parity function is designated "parity node".

To facilitate the understanding of the principles of the invention, the coding method is first of all described on a particular example of a code (k=10, r=4), then is generalized for any code (k, r).

Figure 2:
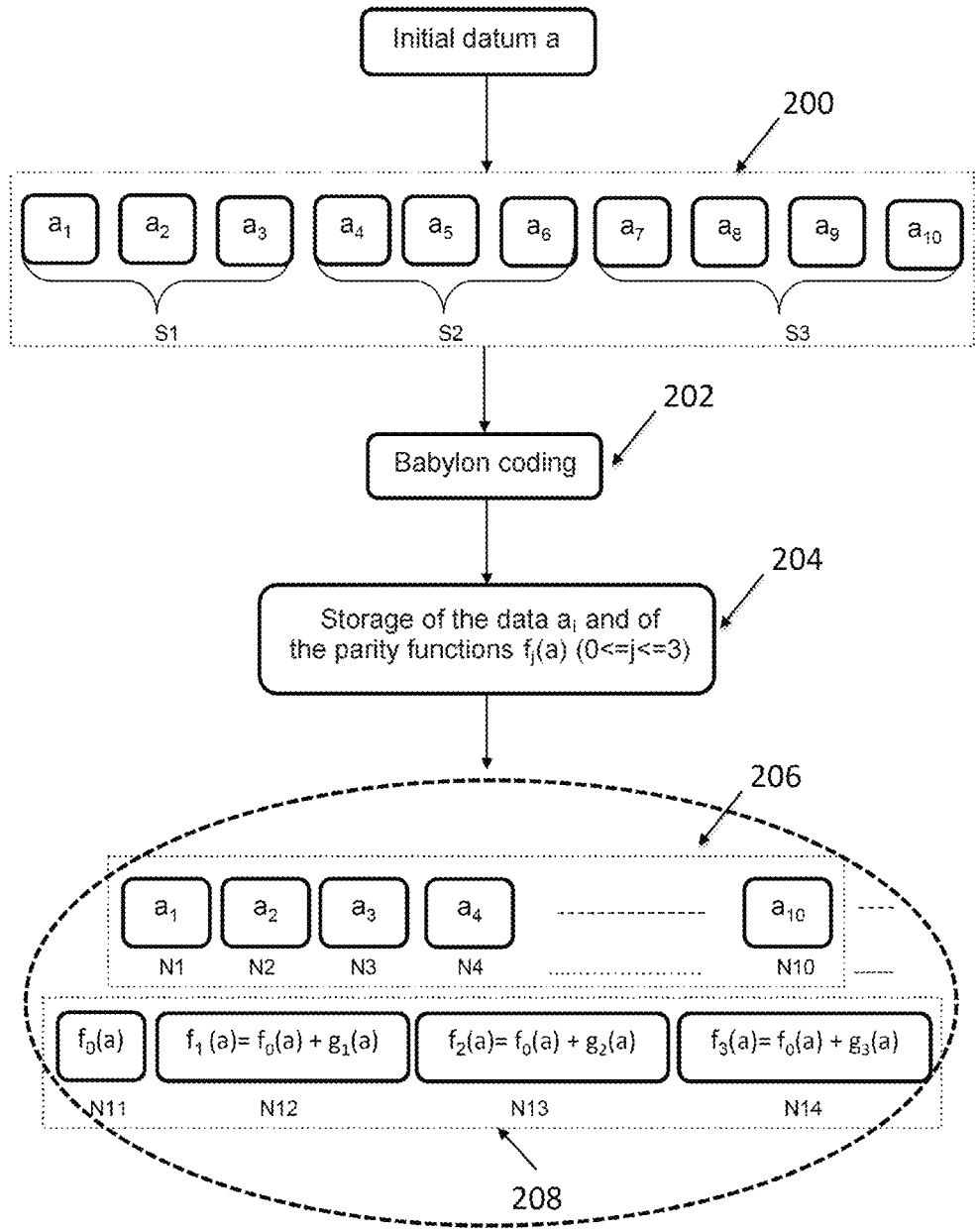
FIG. 2 shows a representation of the storage of the data in an embodiment of the invention.

Description of the coding method on the example of a code (10, 4):

FIG. 2 illustrates a representation of the storage of data by application of the coding method of the invention, based on the example of a code k=10 and r=4. Hereinafter in the description, the coding steps of the present invention can be designated by the expression "Babylon code" or "Babylon coding". An initial datum a is divided into k=10 pieces (200) or data blocks ($a_1$, . . . , $a_{10}$), denoted $a_i$, i∈{1, . . . , 10}, to which are added r=4 parity blocks or parity functions $f_0$, $f_1$, $f_2$ and $f_3$, which are linear combinations of the data ($a_1$, . . . , $a_{10}$) and hereinbelow denoted $f_0(a)$, $f_1(a)$, $f_2(a)$, $f_3(a)$ or $f_0(a)$ and $f_j(a)$, j∈{1, 2, 3}. The parity function $f_0(a)$ is designated as primary parity function, and the parity functions $f_j(a)$ are designated as secondary parity functions. The primary and secondary parity functions are generated according to the Babylon coding (202) of the invention and stored on storage nodes (204).

The systematic data blocks $a_1$ to $a_{10}$ are stored on 10 corresponding systematic storage nodes (206), denoted ($N_1$ to $N_{10}$), and the primary $f_0(a)$ and secondary $f_1(a)$, $f_2(a)$, $f_3(a)$ parity functions are stored on 4 corresponding parity storage nodes (208), denoted $N_{11}$ to $N_{14}$.

Figure 3:
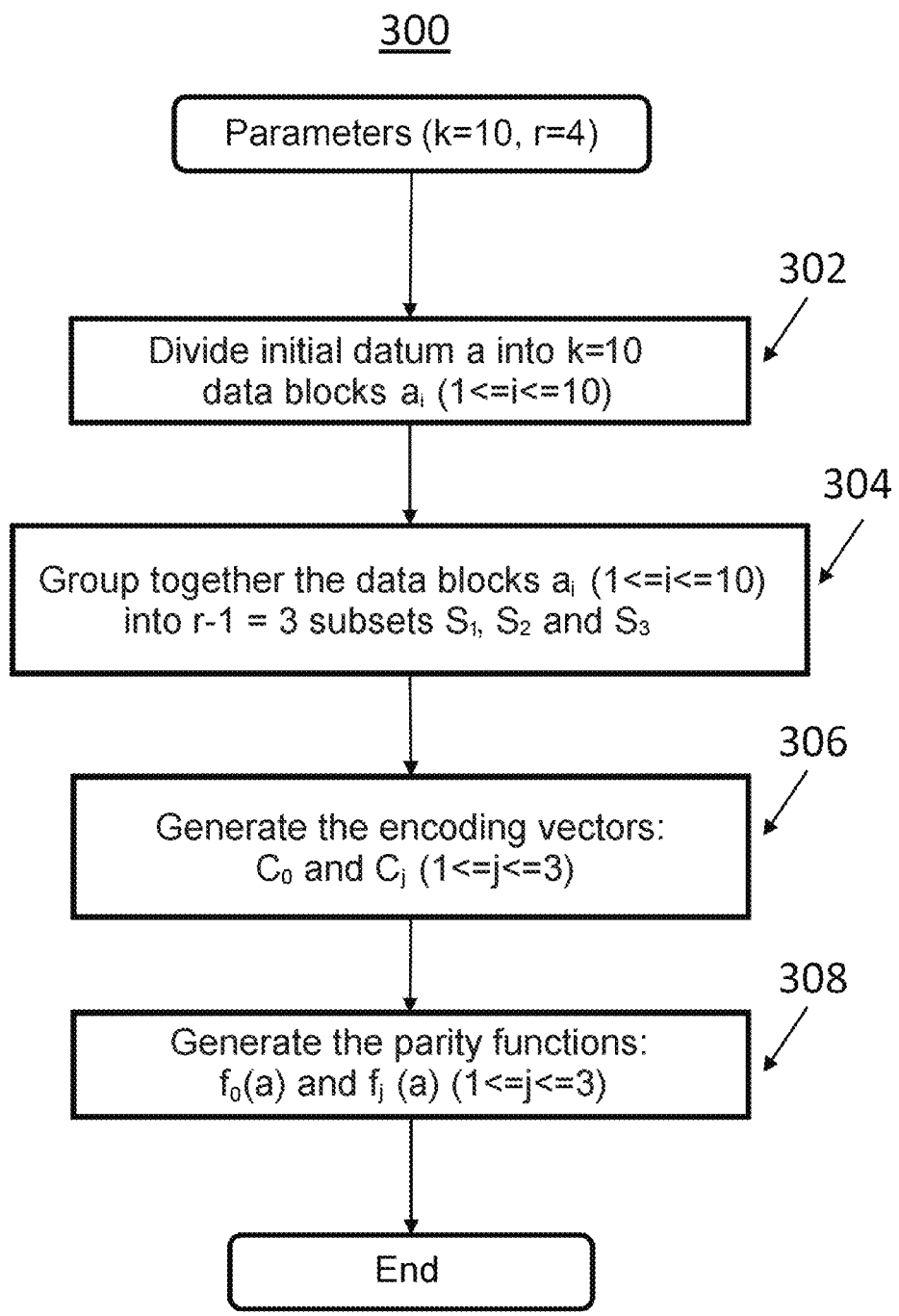
FIG. 3 illustrates the steps of the coding method of the invention in an embodiment.

FIG. 3 illustrates the steps of the coding method (300) of the invention in an embodiment of a code (k=10, r=4). In a first step (302), the method makes it possible to divide an initial datum a into 10 data blocks ($a_1$, . . . , $a_{10}$), then, in a next step (304), to create 3 data subsets ($S_1$, $S_2$, $S_3$). Each data subset comprises different data blocks out of the 10 blocks created. In one embodiment, two subsets ($S_1$, $S_2$) are each composed of 3 data blocks and the third subset ($S_3$) is composed of 4 data blocks. The first subset $S_1$ is composed of the first three blocks ($a_1$, $a_2$, $a_3$) obtained from the initial datum, the second subset $S_2$ is composed of the next three blocks ($a_4$, $a_5$, $a_6$), and the last subset $S_3$ is composed of the last four remaining blocks ($a_7$, $a_8$, $a_9$, $a_{10}$).

In a next step (306), the method makes it possible to generate 4 encoding vectors of length (k=10), corresponding to the 4 parity nodes. The encoding vectors denoted $C_0$ to $C_4$ correspond to a primary encoding vector $C_0$ and 3 secondary encoding vectors $C_1$, $C_2$, $C_3$.

Figure 4:
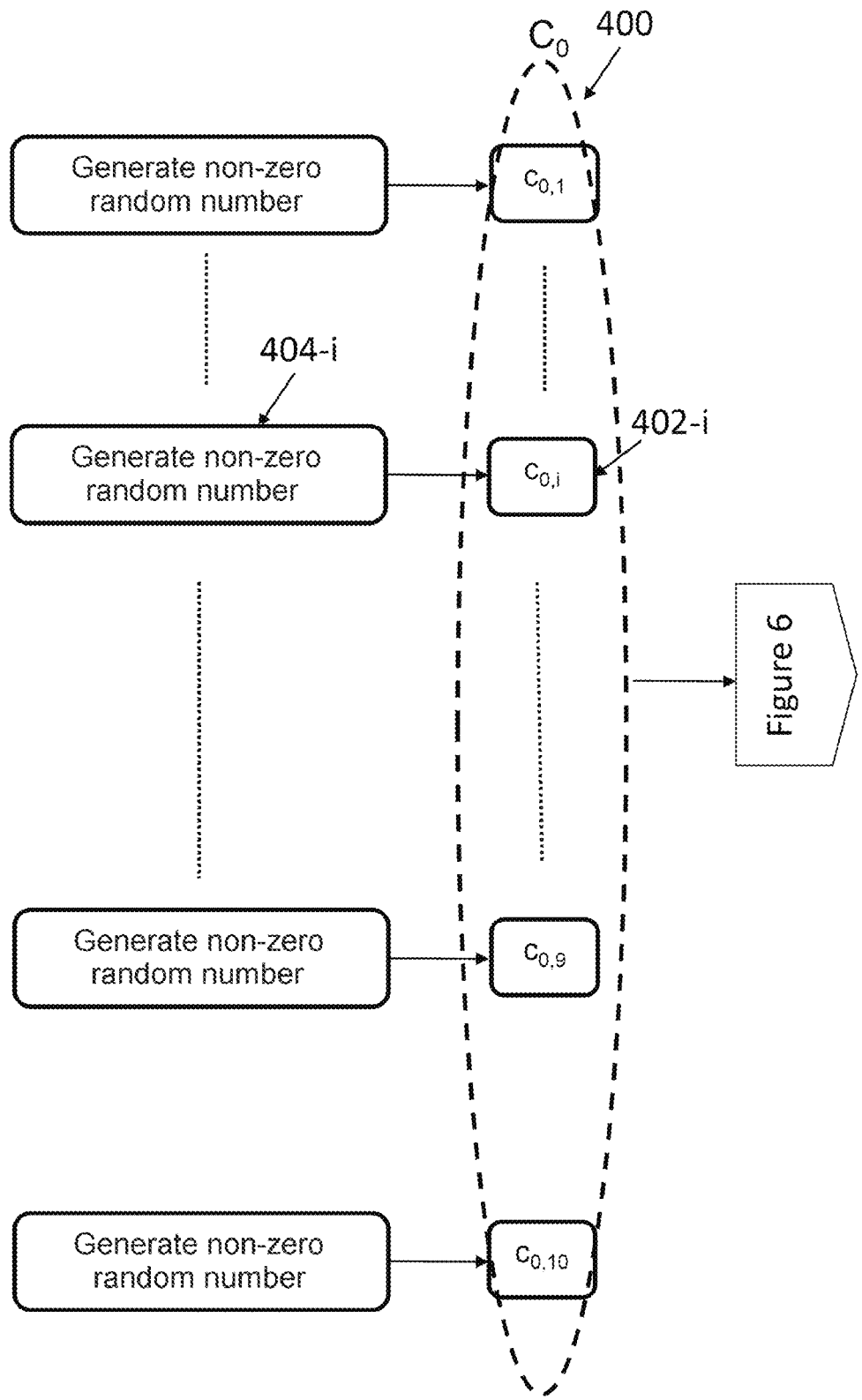
FIG. 4 illustrates the generation of a primary encoding vector, according to the principles of the invention.
Figure 5:
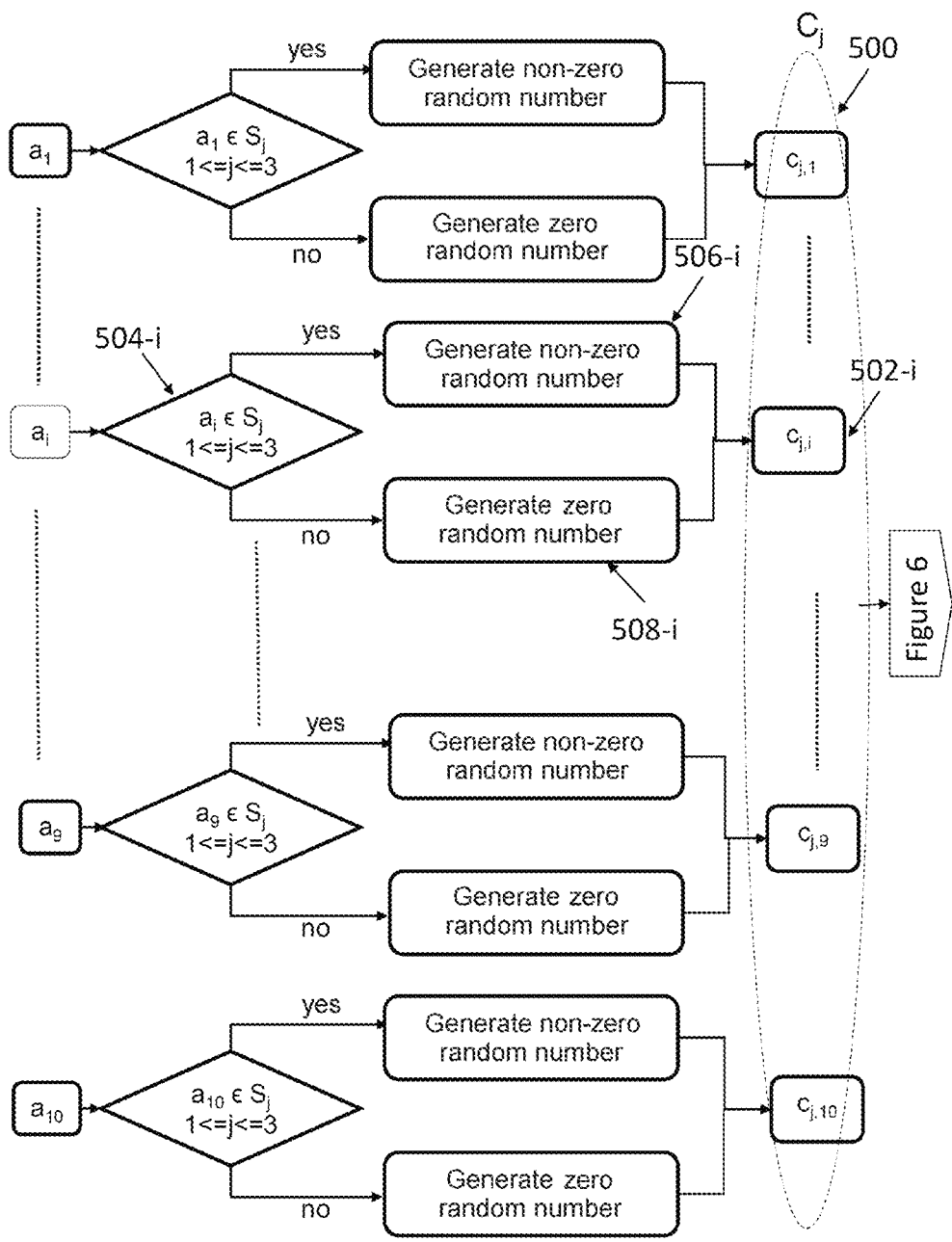
FIG. 5 illustrates the generation of a secondary encoding vector, according to the principles of the invention.

FIGS. 4 and 5 detail the steps of generation of the encoding vectors according to the principles of the invention.

FIG. 4 illustrates the generation of the primary encoding vector $C_0$ (400) in an embodiment. The primary encoding vector $C_0$ is composed of 10 primary encoding coefficients $c_{0,1}$ to $c_{0,10}$ in which each primary encoding coefficient $c_{0,1}$ (402-i) corresponds to a non-zero random number (404-i).

FIG. 5 illustrates the generation of the secondary encoding vectors $C_j$ (1<=j<=3) in an embodiment (500). Each secondary encoding vector $C_j$ is composed of 10 secondary encoding coefficients $c_{j,1}$ to $c_{j,10}$.

To generate a vector $C_j$, the method checks (504-i), for each block $a_i$, whether the block $a_i$ belongs to the subset $S_j$. If such is the case (yes branch), the method makes it possible to associate with the coefficients $c_{j,i}$ non-zero random numbers (506-i). If the blocks as do not belong to the subset $S_j$ (no branch), the method makes it possible to associate with the coefficients $c_{j,i}$ zero random numbers (508-i).

For example, to generate the encoding vector $C_1$, the method checks, for each data block $a_1$, $a_2$, ... $a_{10}$, whether it belongs to the subset $S_1$. Since the data blocks $a_1$, $a_2$, $a_3$ belong to the subset $S_1$, the method therefore generates non-zero random numbers for the coefficients $c_{1,1}$ and $c_{1,3}$. Since the data blocks $a_4$, ..., $a_{10}$ do not belong to $S_1$, the method generates zero random numbers associated with the coefficients $c_{1,4}$ ... $c_{1,10}$.

Thus, for the subset $S_1$, the method makes it possible to generate an encoding vector $C_1$ equal to $c_{1,1}$, $c_{1,2}$, $c_{1,3}$, 0, 0, 0, 0, 0, 0, 0) in which $c_{1,1}$, $c_{1,2}$ and $c_{1,3}$ are non-zero random numbers.

For the subset $S_2$, the method makes it possible to generate an encoding vector $C_2$ equal to (0, 0, 0, $c_{2,4}$, $c_{2,5}$, $c_{2,6}$, 0, 0, 0, 0) in which $c_{2,4}$, $c_{2,5}$ and $c_{2,6}$ are non-zero random numbers.

For the subset $S_3$, the method makes it possible to generate an encoding vector $C_3$ equal to (0, 0, 0, 0, 0, 0, $c_{3,7}$, $c_{3,8}$, $c_{3,9}$, $c_{3,10}$) in which $c_{3,7}$, $c_{3,8}$, $c_{3,9}$ and $c_{3,10}$ are non-zero random numbers.

Returning to FIG. 3, after the step of generation of the encoding vectors, the method makes it possible to generate (308) 4 parity functions as linear combinations of the data blocks ($a_1$, ..., $a_{10}$) comprising a primary parity function $f_0(a)$ and 3 secondary parity functions $f_1(a)$, $f_2(a)$ and $f_3(a)$.

Figure 6:
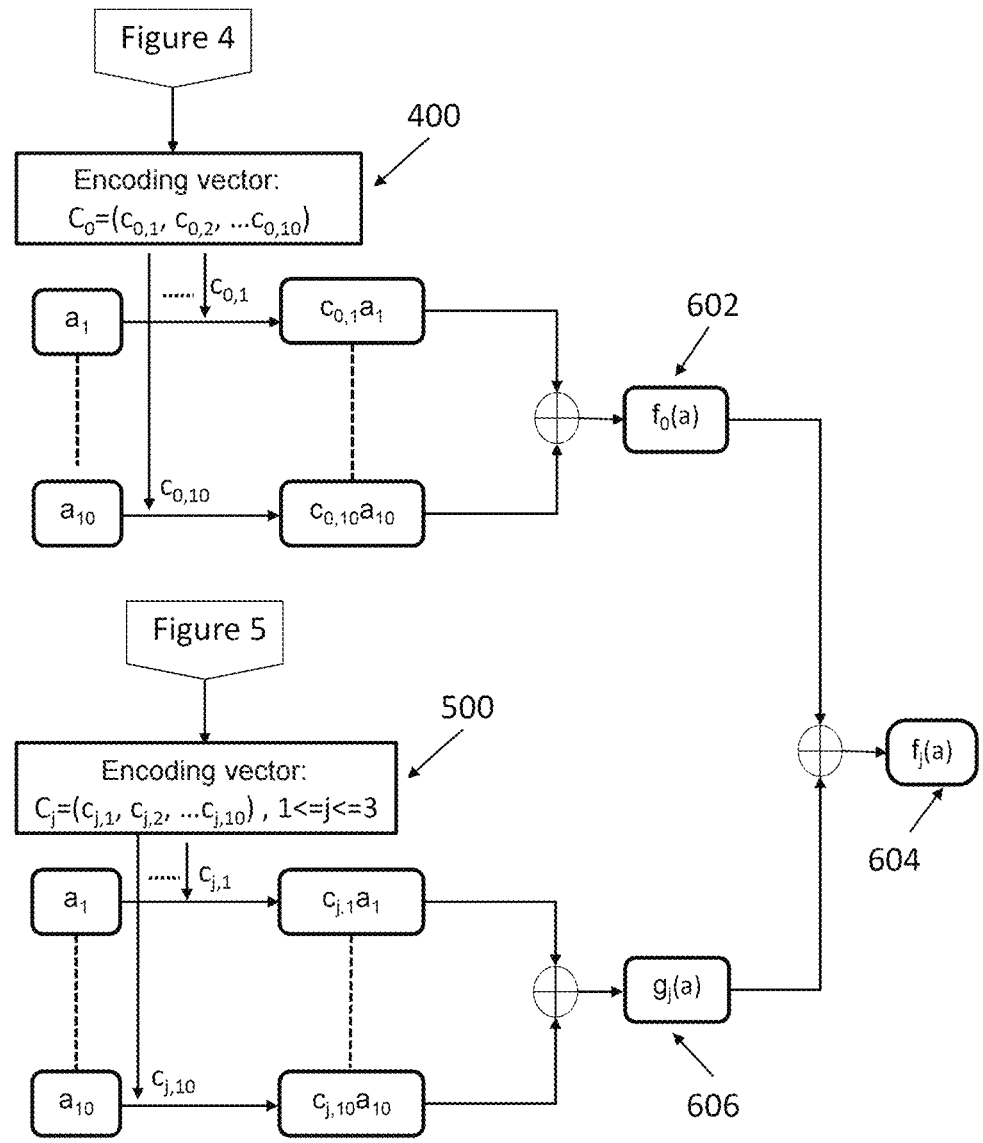
FIG. 6 illustrates the generation of a primary parity function and of a secondary parity function, according to the principles of the invention.

FIG. 6 details the generation of the primary parity function $f_0(a)$, and the secondary parity functions $f_j(a)$ j∈{1, 2, 3} according to the principles of the invention. The primary parity function (602) is a linear combination of the 10 data blocks ($a_1$, ... $a_{10}$) and is stored in the parity node $N_{11}$. Each data block as has an associated encoding coefficient $c_{0,i}$ of the primary encoding vector $C_0$ (400). The primary parity function $f_0(a)$ can be written according to the following equation:

$$f_0(a)=c_{0,1}*a_1+c_{0,2}*a_2+c_{0,3}*a_3+c_{0,4}*a_4+c_{0,5}*a_5+c_{0,6}*a_6+c_{0,7}*a_7+c_{0,8}*a_8+c_{0,9}*a_9+c_{0,10}*a_{10}$$

in which the coefficients $c_{0,1}$, $c_{0,2}$, ..., $c_{0,10}$ are non-zero random numbers.

As illustrated in FIG. 6, to generate the 3 secondary parity functions $f_j(a)$ (1<=j<=3) (604), the method first generates 3 linear functions $g_j(a)$ (1<=j<=3) (606). Each linear function $g_j(a)$ is a linear combination of the 10 data blocks ($a_1$, ..., $a_{10}$) and of the encoding vectors $C_j$ (1<=j<=3) (500).

The linear function $g_1(a)$ is obtained by linear combination of the 10 data blocks ($a_1$, ..., $a_{10}$) and of the encoding vector $C_1$, and it can then be written:

$$g_1(a)=c_{1,1}*a_1+c_{1,2}*a_2+c_{1,3}*a_3.$$

The linear function $g_2(a)$ is obtained by linear combination of the 10 data blocks ($a_1$, ..., $a_{10}$) and of the encoding vector $C_2$, and it can then be written:

$$g_2(a)=c_{2,4}*a_4+c_{2,5}*a_5+c_{2,6}*a_6.$$

Similarly, the linear function $g_3(a)$ is obtained by linear combination of the 10 data blocks ($a_1$, ..., $a_{10}$) and of the encoding vector $C_3$ and can be written:

$$g_3(a)=c_{3,7}*a_7+c_{3,8}*a_8+c_{3,9}*a_9+c_{3,10}*a_{10}.$$

Once the functions $g_j(a)$ (1<=j<=3) are generated, the method makes it possible to create the secondary parity functions $f_1(a)$, $f_2(a)$ and $f_3(a)$. The secondary parity function $f_1(a)$ is obtained by the sum of the primary parity function $f_0(a)$ and of the linear function $g_1(a)$. It can be represented as follows:

$$f_1(a)=f_0(a)+g_1(a)$$

Similarly, the secondary parity function $f_2(a)$ is obtained by the sum of the primary parity function $f_0(a)$ and of the linear function $g_2(a)$. It can be represented as follows:

$$f_2(a)=f_0(a)+g_2(a)$$

Likewise, the secondary parity function $f_3(a)$ is obtained by the sum of the primary parity function $f_0(a)$ and of the linear function $g_3(a)$. It can be represented as follows:

$$f_3(a)=f_0(a)+g_3(a)$$

The secondary parity functions $f_1(a)$, $f_2(a)$, $f_3(a)$ are stored respectively in the parity nodes $N_{12}$, $N_{13}$ and $N_{14}$ (208).

Advantageously, the linear functions $g_1(a)$, $g_2(a)$, $g_3(a)$ and the primary parity function $f_0(a)$ are generated so as to be linearly independent of one another. Moreover, the sum of any two of these functions is also linearly independent of the other functions. Finally, advantageously, since all the data blocks are linearly independent, the Babylon code maintains the same properties as an RS code.

Figure 7A:
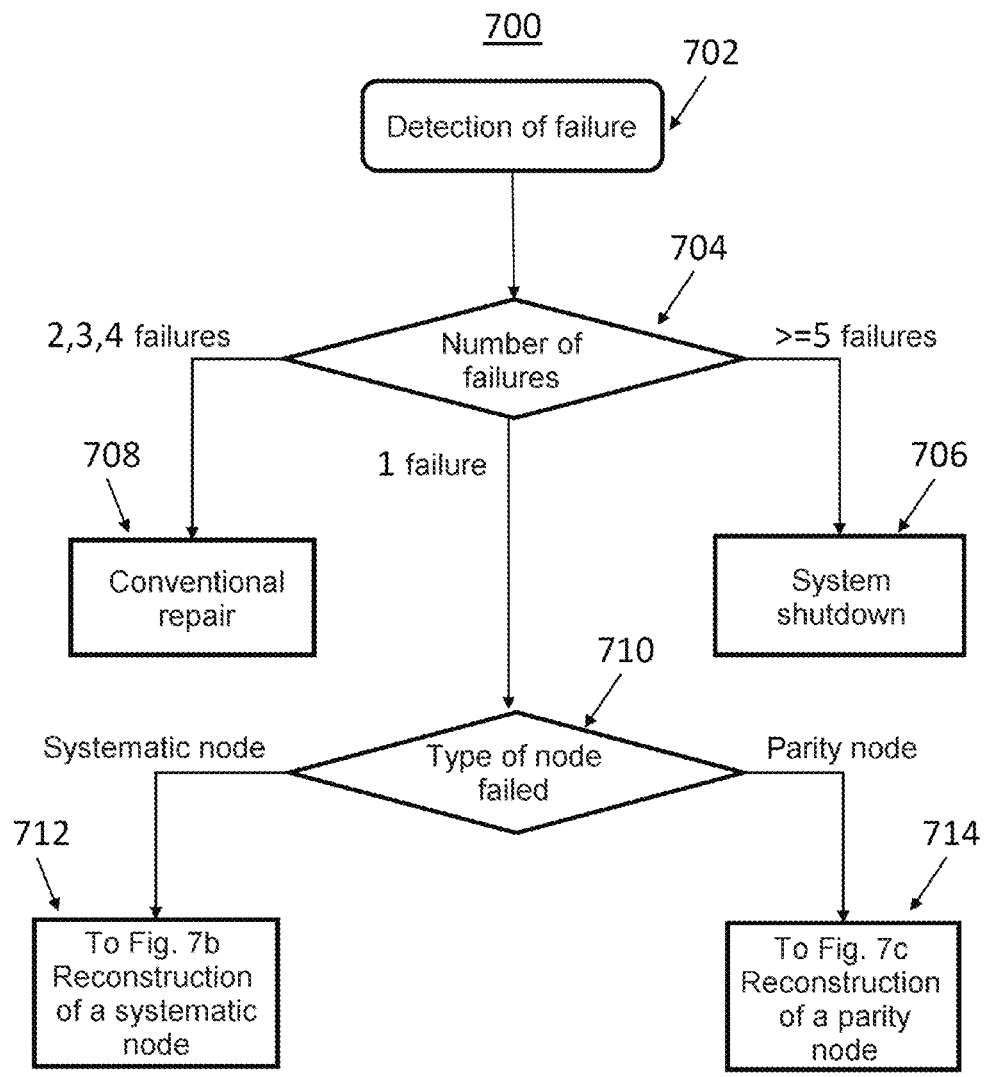
FIGS. 7a to 7c illustrate the steps of reconstruction of systematic and parity nodes according to the principles of the invention.
Figure 7B:
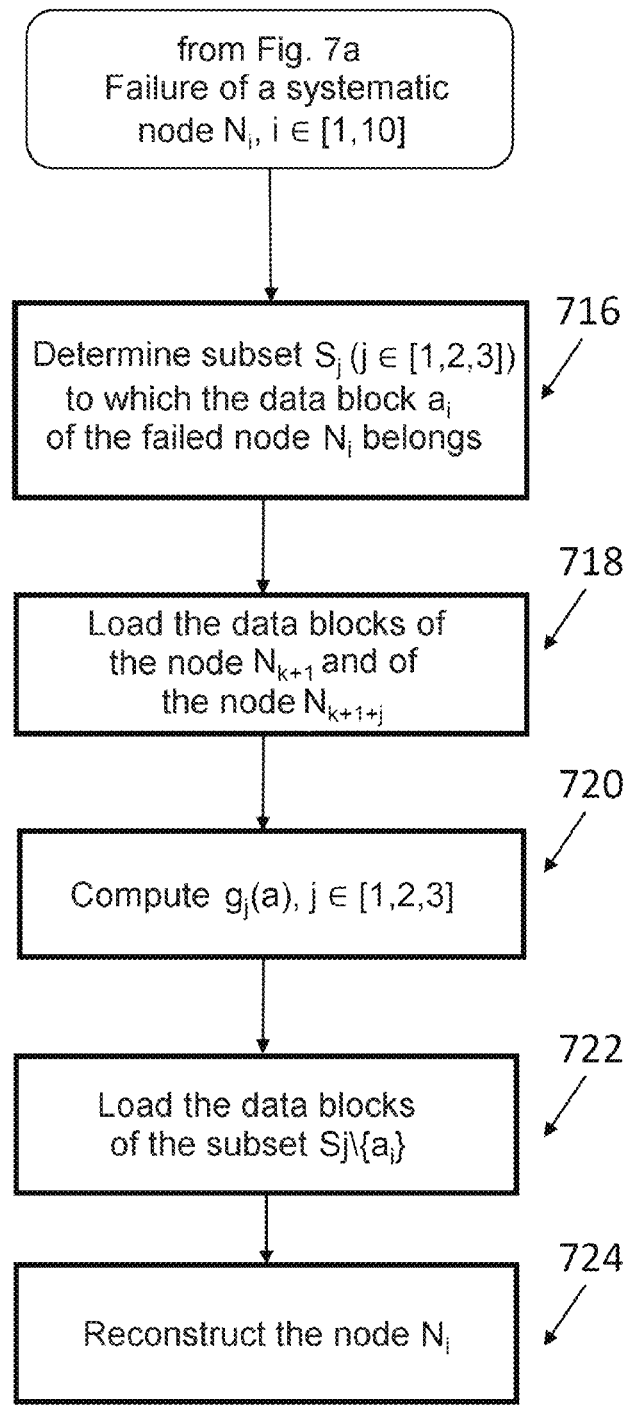
Figure 7C:
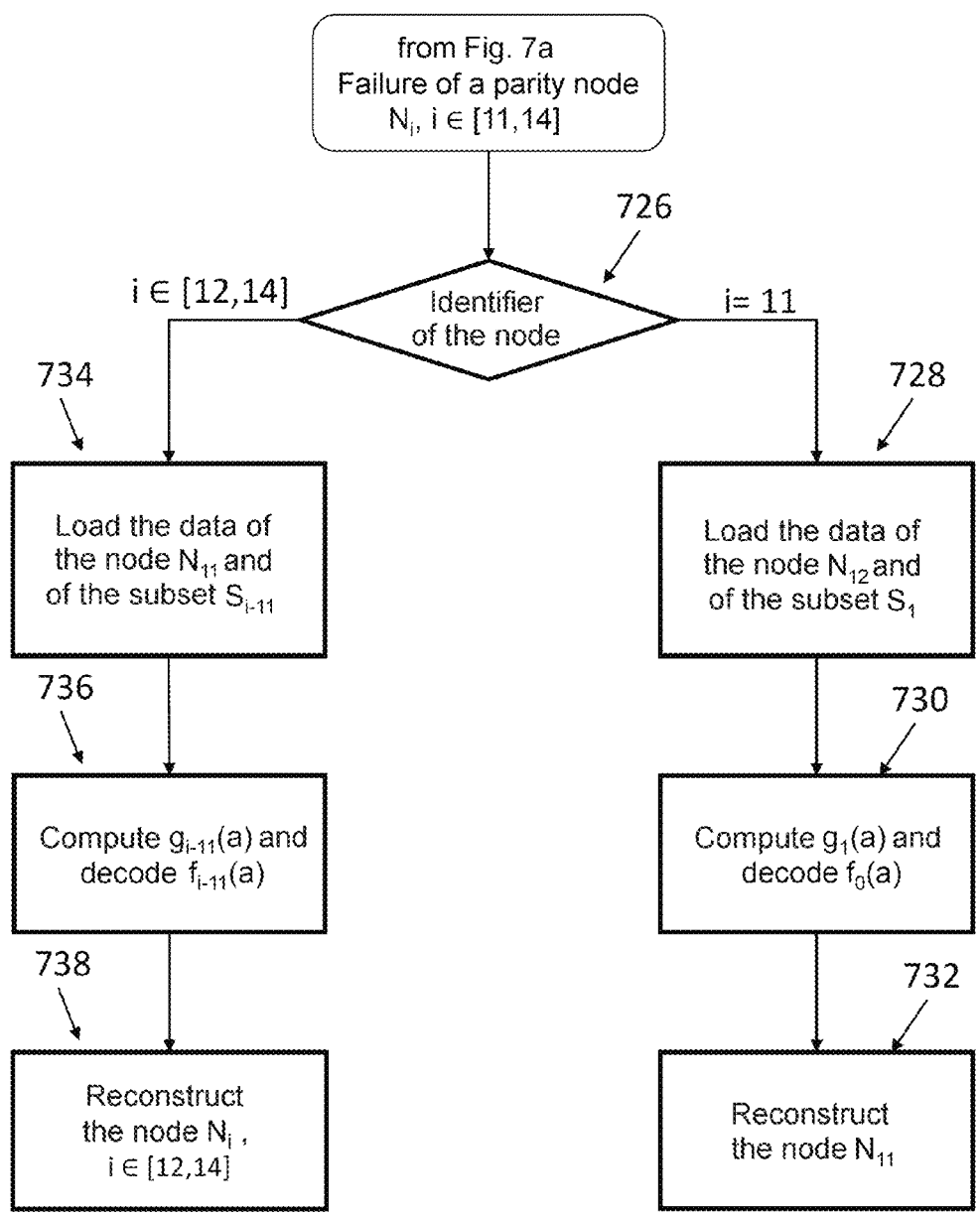

FIGS. 7a to 7c illustrate the steps of detecting failures and of reconstructing the content of systematic nodes and of parity nodes according to the principles of the invention.

As illustrated in FIG. 7a, the method is initiated (702) when information relating to the detection of a failure in the storage system is available indicating the number of failures (704). For the cases where the number of failures is greater than or equal to five, the repair method may not be operative and the system is considered to be defective (706). For the cases where the number of failures lies between two and four failures, the two, three or four nodes that have failed can be reconstructed according to the known repair methods (708), of erasure code or Reed Solomon type.

The method claimed according to the Babylon code works for the cases where a single storage node in a local or distributed storage system has failed. The repair steps will make it possible to retrieve, in the other storage nodes, the lost data which were contained in the failed node and to reconstruct a new storage node with the same data. After a failure is detected, the method determines the nature of the node which has failed (710), namely whether it is a systematic node or a parity node.

In order to facilitate the understanding of the principles of the invention and without limitation, the reconstruction method is first of all described on a particular example of a code (k=10, r=4), then is generalized for any code (k, r).

Description of the decoding method of the invention on the example of a storage system with a code (10, 4):

If the failure relates to a systematic node $N_i$, $i \in \{1, \ldots, 10\}$, that is to say a node storing data blocks $a_i$, the reconstruction (712) is done according to the steps of the method described in FIG. 7b.

If the failure relates to a parity node $N_i$, $i \in \{11, \ldots, 14\}$, that is to say a node storing parity functions, the reconstruction (714) is done according to the steps of the method described in FIG. 7c.

FIG. 7b illustrates the steps of reconstruction of a systematic node according to the present invention.

To illustrate the method, it is assumed that the block $a_1$ located in the node $N_1$ is lost, and that it must be reconstructed. In a first step (716), the method makes it possible to determine the subset of data $S_j$, $j \in [1,2,3]$, to which the datum as of the node $N_i$ that has failed belongs. In the example, the data block $a_1$ belongs to the subset $S_1$, which contains the data ($a_1$, $a_2$, $a_3$). In a next step (718), the method makes it possible to retrieve the data of the primary parity function $f_0(a)$ which are stored in the node $N_{11}$ and to retrieve the data of the secondary parity function $f_1(a)$ corresponding to the index of the identified subset $S_1$, which are stored in the node $N_{12}$. The expression "retrieve the data" is used to denote operations of transferring of the data from a storage node to a data collecting device. The data collecting device can be incorporated in a general storage system controller, where the node reconstruction method can be implemented. The retrieval of the data also includes the operations of reading/writing from/into memory elements of the storage nodes and of the data collecting device.

After the data collection step, the method makes it possible (720), from the retrieved data, to compute the linear function $g_1(a)$ associated with the subset of data $S_1$. In one embodiment, the linear function $g_j(a)$ is obtained by subtraction of the primary parity function $f_0(a)$ located in the node $N_{11}$ from the secondary parity function $f_1(a)$ located in the node $N_{12}$.

In a next step (722), the method makes it possible to load the data blocks ($a_2$, $a_3$) of the subset $S_1$, except for the block $a_1$ which is lost. By subtracting these data from the linear function $g_1(a)$, the datum $a_1$ is retrieved and the primary storage node $N_1$ for the lost data block $a_1$ is reconstructed (724).

The reconstruction of the node for $a_1$ needs to use only 4 data blocks $\{a_2, a_3, f_0(a), f_1(a)\}$, unlike a conventional RS code which would have required 10 blocks, i.e. a saving of 60%. Similarly, the reconstruction of a systematic node for any data block $a_i$ for $i \in \{1, 2, 3\}$, requires only 4 blocks, by using the data blocks having the index $i \in \{1, 2, 3\} \setminus \{i\}$, that is to say except for the data block of index i corresponding to the node $N_i$ that has failed, and by using the data blocks of the primary parity $f_0(a)$ and secondary parity $f_1(a)$ functions.

The reconstruction of a systematic node for any data block $a_i$ for $i \in \{4, 5, 6\}$ requires 4 blocks, by using the data blocks having the index $i \in \{4, 5, 6\} \setminus \{i\}$ and by using the data blocks of the primary parity $f_0(a)$ and secondary parity $f_2(a)$ functions.

The reconstruction of a systematic node for any data block $a_i$ for $i \in \{7, 8, 9, 10\}$ requires 5 blocks, by using the data blocks having the index $i \in \{7, 8, 9, 10\} \setminus \{i\}$ and by using the data blocks of the primary parity $f_0(a)$ and secondary parity $f_3(a)$ functions.

FIG. 7c illustrates the steps of reconstruction of a parity node according to the present invention.

The nodes $N_i$, $i \in [11,14]$ contain the primary $f_0(a)$ and secondary $f_1(a)$, $f_2(a)$, $f_3(a)$ parity functions. The method first of all determines (726) whether the node to be repaired is $N_{11}$ which contains the primary parity function $f_0(a)$. If yes, the method makes it possible to transfer (728) the data $f_1(a)$ and those of the subset $S_1$ containing $a_1$, $a_2$ and $a_3$ from the nodes $N_{12}$, $N_1$, $N_2$ and $N_3$. In a next step (730), the method makes it possible to generate the linear function $g_1(a)$ using the data $a_1$, $a_2$ and $a_3$, then to decode the primary parity function $f_0(a)$ by subtracting the linear function $g_1(a)$ from the parity function $f_1(a)$. The method then makes it possible to reconstruct the node $N_{11}$.

Like the nodes i, $i \in \{1, \ldots, 10\}$, the repair of $N_{11}$ requires only 4 data blocks ($f_1(a)$, $a_1$, $a_2$ and $a_3$).

Returning to the step (726), if the node to be repaired is a parity node $N_i$ such that $i \in [12,14]$, the method makes it possible to load (734) the data of the node $N_{11}$ which contains the parity function $f_0(a)$, and load the data of the subsets $S_{i-11}$. In a next step (736), the method makes it possible to generate the linear function $g_{i-11}(a)$ using the data of the subsets and to decode the parity function $f_{i-11}(a)$ by effecting the sum of the primary parity function $f_0(a)$ and of the linear function $g_{i-11}(a)$. The method then makes it possible to reconstruct (738) the node $N_i$, $i \in [12,14]$.

Thus, for the reconstruction of the node $N_{12}$ containing the secondary parity function $f_1(a)$, the method makes it possible to load the parity function $f_0(a)$ of the node $N_{11}$ and the data of the subset $S_1$ ($a_1$ from the node $N_1$, $a_2$ from the node $N_2$ and $a_3$ from the node $N_3$). In a first stage, the parity function $g_1(a)$ is generated using the data $a_1$, $a_2$ and $a_3$ of the subset $S_1$. Next, the secondary parity function $f_1(a)$ is decoded by effecting the sum of $f_0(a)$ and $g_1(a)$ and the node $N_{12}$ is reconstructed.

Likewise, for the reconstruction of the node $N_{13}$ containing the secondary parity function $f_2(a)$, the method makes it possible to load the data of the node $N_{11}$ which contains the parity function $f_0(a)$ and the data of the subset $S_2$. In a first stage, the parity function $g_2(a)$ is generated using the data $a_4$, $a_5$ and $a_6$ of the subset $S_2$. Next, the secondary parity function $f_2(a)$ is decoded by effecting the sum of $f_0(a)$ and $g_2(a)$ and the node $N_{13}$ is reconstructed.

Finally, for the reconstruction of the node $N_{14}$ containing the secondary parity function $f_3(a)$, the method makes it possible to load the parity function $f_0(a)$ contained in the node $N_{11}$ and the data of the subset $S_3$. In a first stage, the parity function $g_3(a)$ is generated using the data $a_7$, $a_8$, $a_9$, and $a_{10}$ of the subset $S_3$. Next, the secondary parity function $f_3(a)$ is decoded by effecting the sum of $f_0(a)$ and $g_3(a)$ and the node $N_{14}$ is reconstructed.

It should be noted that the repair of the nodes $N_{12}$ and $N_{13}$ requires only the transfer of 4 data blocks, respectively $\{f_0(a), a_1, a_2 \text{ and } a_3\}$ and $\{f_0(a), a_4, a_5 \text{ and } a_6\}$, and that the repair of the node $N_{14}$ requires the transfer of 5 data blocks $\{f_0(a), a_7, a_8, a_9, a_{10}\}$.

Thus, advantageously, the claimed reconstruction method requires only 4 or 5 data blocks for the reconstruction of any node $i \in \{1, \ldots, 14\}$. It makes it possible to reduce the bandwidth and the inputs/outputs by 50% to 60% compared to an RS code.

The general principle of the coding method of the invention is now described for any code (k, r):

Starting from a datum a as input of size M, the general principle of the invention consists in dividing the datum into k data blocks $(a_1, \ldots, a_k)$, each block having a size M/k. Each data block as stored in the node $N_i$ is of fixed size m=M/k.

The following notations are suitable for the description below:

$\lfloor X \rfloor$ expresses the integer part of X; and $\lceil X \rceil$ expresses the excess integer part of X.

The Babylon coding method begins with a step of division of the k data blocks $(a_1, \ldots, a_k)$ into (r−1) subsets $(S_1, S_2, \ldots, S_{r-1})$, denoted $S_j$, $1 \leq j \leq r-1$. If k is a multiple of r−1, the subsets have one and the same size k/r−1. If k is not a multiple of r−1, each of the r−1−q first subsets is composed of $t_f$ data blocks, and the following q subsets contain $t_c$ data blocks with:

$$t_f = \lfloor k/r-1 \rfloor,$$

$$t_c = \lceil k/r-1 \rceil, q = k \bmod(r-1)$$

The first subset $S_1$ is composed of data blocks belonging to $(a_1, \ldots, a_{tf})$. The $j^{th}$ subset $S_j$ is composed of data blocks belonging to $(a_{(j-1)tf+1}, \ldots, a_{jtf})$, for $(1 \leq j \leq r-1)$.

The second step of the method consists in generating r encoding vectors comprising a primary encoding vector $C_0$ and r−1 secondary encoding vectors $C_j$ $(1 \leq j \leq r-1)$.

The primary encoding vector $C_0$ is composed of k encoding coefficients $c_{0,1}$ to $c_{0,k}$ in which each primary encoding coefficient $c_{0,i}$ corresponds to a non-zero random number.

A secondary encoding vector $C_j$ is composed of k encoding coefficients $c_{j,1}$ to $c_{j,k}$. To generate a secondary encoding vector $C_j$, the method checks, for each block $a_i$, whether the block $a_i$ belongs to the subset $S_j$. If such is the case, then the method makes it possible to associate non-zero random numbers with the coefficients $c_{j,i}$, and if the block as does not belong to the subset $S_j$, then the method makes it possible to associate zero random numbers with the coefficients $c_{j,i}$.

The structure of the encoding vectors $C_0$ to $C_{r-1}$ is represented hereinbelow:

$$c_0 = [c_{0,1}, c_{0,2}, \ldots, c_{0,k}]$$

$$c_1 = [c_{1,1}, c_{1,2}, c_{1,tf}, \ldots, 0, \ldots, 0]$$

$$c_2 = [0, \ldots, 0, c_{2,tf+1}, \ldots, c_{2,2tf}0, \ldots, 0]$$

$$\ldots$$

$$c_{r-q} = [0, \ldots, 0, c_{r-q,(r-q-1),tf+1}, \ldots, c_{r-q,(r-q)tc}, 0, \ldots, 0]$$

$$c_{r-q+1} = [0, \ldots, 0, c_{r-q+1,(r-q),tc+1}, \ldots, c_{r-q+1,(r-q),tc}, 0, \ldots, 0]$$

$$\ldots$$

$$c_{r-1} = [0, \ldots, \ldots, \ldots, 0, c_{r-1,rtc+1}, \ldots, c_{r-1,k}].$$

After the step of generation of the encoding vectors, the method makes it possible to generate r parity functions, linear combinations of the data $(a_1, \ldots, a_k)$ and composed of a primary parity function $f_0(a)$ and of r−1 secondary parity functions $f_1(a), \ldots, f_{r-1}(a)$.

The primary parity function is a linear combination of the k data blocks $(a_1, \ldots, a_k)$ and is stored in the parity node of index k+1, $N_{k+1}$. Each data block $a_i$ has an associated encoding coefficient $c_{0,i}$ of the primary encoding vector $C_0$.

The primary parity function $f_0(a)$ can be written according to the following equation:

$$f_0(a) = c_{0,1}*a_1 + c_{0,2}*a_2 + \ldots + c_{0,k}*a_k$$

in which the coefficients $c_{0,1}, c_{0,2}, \ldots, c_{0,k}$ are non-zero random numbers.

To generate the r−1 secondary parity functions $f_j(a)$ $(1 \leq j \leq r-1)$, the method makes it possible to generate first of all r−1 linear functions $g_j(a)$ $(1 \leq j \leq r-1)$. Each linear function $g_j(a)$ is a linear combination of the k data blocks $(a_1, \ldots, a_k)$ and of the encoding vectors $C_j$ $(1 \leq j \leq r-1)$. Once the linear functions $g_j(a)$ $(1 \leq j \leq r-1)$ are generated, the method makes it possible to create the secondary parity functions $f_1(a), f_2(a), \ldots f_{r-1}(a)$ such that a secondary parity function $f_j(a)$, $1 \leq j \leq r-1$, is obtained by adding the primary parity function $f_0(a)$ to a linear function $g_j(a)$:

$$f_j(a) = f_0(a) + g_j(a)$$

The data blocks and the parity functions generated according to the coding of the invention are stored in storage nodes of a local or distributed storage system. The k data blocks $(a_1, \ldots, a_k)$ are stored in k systematic nodes $N_i$, $i \in \{1, \ldots k\}$ and each of the r parity blocks obtained by a parity function is stored in a parity node $N_i$, $i \in \{k+1, \ldots, k+r\}$, as illustrated in the table below:

| Node 1 | $a_1$ |
|---|---|
| . | . |
| . | . |
| Node k | $a_k$ |
| Node k + 1 | $f_o(a)$ |
| Node k + 2 | $f_o(a) + g_1(a)$ |
| . | . |
| . | . |
| Node k + r | $f_o(a) + g_{r-1}(a)$ |

Advantageously, the linear functions $g_j(a)$, $1 \leq j \leq r-1$ and the primary parity function $f_0(a)$ are generated so as to be linearly independent of one another. Moreover, the sum of any two of these functions is also linearly independent of the other functions. Finally, advantageously, all the data blocks being linearly independent, the Babylon code maintains the same properties as an RS code.

The general principle of the reconstruction method of the invention is now described for any code (k, r). The reconstruction method is initiated when information relating to the detection of a failure in the storage system is available. The method can be initiated to duplicate the content of a node. The reconstruction method in the case of a failure works for the cases in which a single storage node in a local or distributed storage system has failed. The repair steps will make it possible to retrieve, in the other storage nodes, the lost data which were contained in the node that has failed and to reconstruct a new storage node with the same data.

When a failure is detected, the method determines the nature of the node which has failed, namely whether it is a systematic node or a parity node.

If the failure relates to a systematic node $N_i$, $i \in \{1, \ldots, k\}$, that is to say a node storing data blocks $a_i$, the reconstruction is done according to the case 1 described hereinbelow.

If the failure relates to a parity node $N_i$, $i \in \{k+1, \ldots, k+r\}$, that is to say a node storing parity functions, the reconstruction is done according to the case 2 described hereinbelow.

Case 1: Reconstruction of the Nodes $N_i$, $i \in \{1, \ldots k\}$

Considering a repair of the datum as stored in a node $N_i$ such that $(1 \leq i \leq k)$ with $a_i \in S_j$ and $(1 \leq j < r)$, the method makes it possible, initially, to transfer the data contained in the nodes of index k+1, $N_{(k+1)}$ and of index k+1+j, $N_{(k+1+j)}$. Next, the datum $f_0(a)$, stored in the node of index k+1, $N_{(k+1)}$, is subtracted from the datum $f_j(a)$ stored in the node of index k+1+j, $N_{(k+1+j)}$ to recover the linear function $g_j(a)$ associated with the subset $S_j$. The method then makes it possible to transfer the data of the subset $S_j\backslash\{a_i\}$ (that is to say, except for the data block $a_i$). The use of the linear function $g_j(a)$ makes it possible to decode the lost datum $a_i$. The number of data blocks needed to reconstruct as is therefore $(t_f+1)$ if i belongs to the (r−1−q) first subsets. If i belongs to the q last subsets, the total number of data blocks required is $(t_c+1)$.

Case 2: Reconstruction of the Nodes $N_i$, i∈{k+1, . . . , k+r}

As in the preceding case, for the reconstruction of the node $N_i$ such that k+1<i≤k+r, the method makes it possible to transfer the datum $f_0(a)$ stored in the node of index k+1, $N_{(k+1)}$, and the data located in the subset $S_{i−k+1}$. The linear function $g_{i−k+1}(a)$ is obtained from the data of the subset $S_{i−k+1}$. Next, the decoding is performed by using the primary function $f_0(a)$ and the linear function $g_{i−k+1}(a)$ to retrieve the secondary function $f_{i−k+1}(a)$ (in effect, $f_{i=k+1}(a)=f_0(a)+g_{i−k+1}(a)$). It should be noted that if (i−k+1) belongs to the (r−1−q) first blocks, the repair requires $(t_r+1)$ data blocks. If (i−k+1)∈{r−q, . . . , r−1}, then the repair requires $(t_c+1)$ blocks.

For the particular case of the node of index k+1, $N_{k+1}$ containing the primary parity function $f_0(a)$, the method makes it possible to transfer the first subset $S_1$ to generate the linear function $g_1(a)$. The method then makes it possible to transfer the data from the node of index k+2, $N_{k+2}$ containing the secondary parity function $f_1(a)$. By subtracting the linear function $g_1(a)$ from the secondary parity function $f_1(a)$, the primary parity function $f_0(a)$ is decoded (in effect, $f_0(a)=f_1(a)−g_1(a)$). The datum of the node of index k+1, $N_{k+1}$ containing the primary parity function $f_0(a)$, is retrieved by using $(t_f+1)$ data blocks.

Generally, the average value of the data transferred and read for the reconstruction/repair, whatever the type of node, is given by the following equation:

$$\gamma = \frac{1}{(k+r)}[((r-1-q)\times t_j + (r-q))\times(t_j+1)) + (q(L_c+1)^2)]$$

It should be noted that the description takes for the example a value of r>=3. For a value r=1, the Babylon code acts as a conventional RS code. For a value r=2, the data are divided into two subsets $S_1$ and $S_2$, in which $S_1$ is composed of the $t_s$ first blocks and $S_2$ contains the k−$t_s$ last blocks, in which $t_s=\lfloor k/\rfloor$.

Advantageously, the method of the invention makes it possible to not use all the nodes in the reconstruction process. Moreover, the nodes contributing to the reconstruction do not have to perform computations, but they simply have to transfer their content to a data collector where the decoding operations will be performed. The data collector can be the new storage node replacing the failed node.

Still advantageously, by virtue of the Babylon coding method, the reconstruction time is reduced compared to the methods based on matrices in which all of the data blocks of the k nodes are necessary for the reconstruction.

Figure 8:
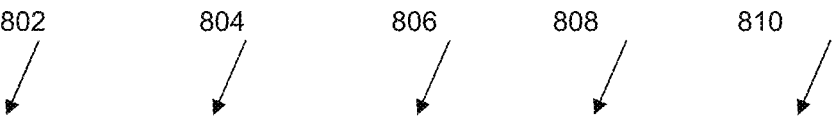
FIG. 8 is a table comparing the performance levels of different codes.

FIG. 8 is a comparative table of the performance levels comparing the results of different known codes with those obtained by the Babylon code of the present invention. In the table (800), the first column lists the compared codes: RS; regenerators; exact regenerators; hierarchical; hitchhiker; and Babylon.

For all the codes, a file of the same size of M bytes coded using a (k=10, r=4) configuration was considered.

The evaluation was done for each code for one and the same storage efficiency (71%) column (804) on different parameters: the average bandwidth required for the repair (806), the disc inputs/outputs (808) and the tolerance to failures (810). The bandwidth and the disc inputs/outputs are expressed as a percentage relative to the size M of the original file. The percentages in the table are computed by taking account of the repair of the systematic nodes and of the parity nodes.

The results are as follows:

For an RS code, the repair of a single failure requires M bytes to be read and transferred. This is equivalent to 100% of the original size of the file.

For the same storage efficiency, the bandwidth required by the regenerator codes and the exact regenerator codes are computed. The bandwidth used for the repair of a failure is on average equal to 32.5%. However, the disc inputs/outputs are not optimized. To repair a single failure, the regenerator codes require all the data stored in the nodes to be read before they are transferred.

The hierarchical code optimizes both the bandwidth and the disc inputs/outputs. The quantity of the data read and transferred in the network is equal to 33.57%. However, the hierarchical code does not maintain the same tolerance to failures as the RS codes. In effect, it is not possible to tolerate any 4 failures by using the hierarchical code.

The hitchhiker code makes it possible to both optimize the bandwidth and the disc inputs/outputs while maintaining the same tolerance to failures as the RS code. In this case, the quantity of the data read and transferred is equal to 76.42%.

The Babylon code requires on average 43.57% of the size of the original file to repair a single failure in terms of bandwidth and of disc inputs/outputs. It also makes it possible to tolerate any 4 failures out of the 14 nodes.

The present invention can be implemented from hardware and/or software elements. It can be available as a computer program product on a computer-readable medium. The medium can be electronic, magnetic, optical or electromagnetic. In one embodiment, the method is implemented by computer. A computer program product is described, said computer program comprising code instructions making it possible to perform one or more of the steps of the method, when said program is run on a computer. In one embodiment, the device for implementing the invention comprises a computer-readable storage medium (RAM, ROM, flash memory or another memory technology, for example disc medium or another non-transient computer-readable storage medium) coded with a computer program (that is to say several executable instructions) which, when it is run on one or more processors, performs the functions of the embodiments described previously. As an example of hardware architecture suitable for implementing the invention, a device can comprise a communication bus to which are linked a central processing unit or microprocessor (CPU, acronym for Central Processing Unit), which processor can be "multi-core" or "many-core"; a read-only memory (ROM) that can comprise the programs necessary for the implementation of the invention; a random access memory or cache memory (RAM) comprising registers suitable for saving variables and parameters created and modified during the execution of the abovementioned programs; and a communication or I/O (input/output) interface, suitable for transmitting and receiving data. In the case where the invention is installed on a reprogrammable computation machine (for example an FPGA circuit), the corresponding program (that is to say the sequence of instructions) can be stored in or on a removable storage medium (for example an SD card, or a mass storage such as a hard disc, e.g. an SSD) or non-removable, volatile or non-volatile storage medium, this storage medium being partially or totally readable by a computer or a processor. The computer-readable medium can be transportable or communicable or mobile or transmissible (i.e. by a 2G, 3G, 4G, Wifi, BLE, fibre optic or other telecommunication network). The reference to a computer program which, when it is run, performs any one of the functions described previously, is not limited to an application program running on a single host computer. On the contrary, the terms computer program and software are used here in a general sense to refer to any type of computer code (for example, application software, firmware, microcode, or any other form of computer instruction, such as web services or SOA or via programming interfaces API) which can be used to program one or more processors to implement aspects of the techniques described here. The computer means or resources can in particular be distributed ("cloud computing"), possibly with or according to pair-to-pair and/or virtualization technologies. The software code can be executed on any appropriate processor (for example, a microprocessor) or processor core or a set of processors, whether they are provided in a single computation device or distributed between several computation devices (possibly accessible in the environment of the device). Securing technologies (crypto-processors, authentication, encryption, chip card, etc) can be used.

The invention claimed is:

1. A method for coding (k, r) data comprising:
dividing with a controller an initial datum a into k data blocks a of a same size;
grouping with the controller the k data blocks into r−1 disconnected subsets $S_j$ of data blocks;
generating with the controller, for each of the subsets $S_j$, a linear function $g_j(a)$ defined as a linear combination of the data blocks assigned to said subsets $S_j$; and
generating with the controller, r parity functions comprising a primary parity function $f_0(a)$ as a linear combination of the k data blocks $a_i$, and r−1 secondary parity functions, each secondary parity function $f_j(a)$ being defined as a sum of the primary parity function $f_0(a)$ and of the linear function $g_j(a)$,
wherein the k data blocks $a_i$ and the r parity functions $f_j(a)$ are configured to reconstruct a content of a storage device;
wherein the datum a is the initial datum;
wherein k is a number of data blocks the initial datum a is divided; and
wherein r is a number of parity functions comprising a primary parity function $f_0(a)$.

2. The method according to claim 1, wherein the generating r parity functions includes generating r encoding vectors comprising:
a primary encoding vector $C_0$ composed of k primary encoding coefficients $c_{0,1}$ to $c_{0,k}$; and
r−1 secondary encoding vectors $C_j$, where $1 \leq j \leq r-1$, each secondary encoding vector being composed of k secondary encoding coefficients $c_{j,1}$ to $C_{j,k}$.

3. The method according to claim 2, wherein each primary encoding coefficient $c_{0,i}$ corresponds to a non-zero random number, and a secondary encoding coefficient $c_{j,i}$ corresponds to a non-zero or zero random number depending on whether the data block a belongs to or does not belong to the subset $S_j$.

4. The method according to claim 3, wherein the step of generating a linear function $g_j(a)$ includes generating a linear combination from the k data blocks $(a_1, \ldots, a_k)$ and from the k secondary encoding coefficients $c_{j,1}$ to $c_{j,k}$ of the secondary encoding vector $C_j$.

5. The method according to claim 1, wherein k=10 and r=4.

6. A method for storing k+r data that comprises obtaining r parity functions according to claim 1, the method further comprising:
storing, in k systematic storage devices $N_i$, $i \in \{1, \ldots, k\}$, k data blocks $a_i$, and in storing, in r parity storage devices $N_i$, $i \in \{k+1, \ldots, k+r\}$, r parity functions.

7. A device for coding data comprising means suitable for implementing the steps of the data coding method according to claim 1.

8. An integrated circuit of ASIC or FPGA type comprising at least one device according to claim 7.

9. A method for reconstructing a content of a storage device out of a plurality of devices storing k data blocks $a_i$ in k systematic storage devices $N_i$, $i \in \{1, \ldots, k\}$, and r parity functions $f_j(a)$ in r parity storage devices $N_i$, $i \in \{k+1, \ldots, k+r\}$, said k data blocks and r parity functions being obtained according to the method of claim 1, the reconstruction method comprising:
determining whether the storage device for which to reconstruct the content is a systematic or parity storage device;
if said device is a systematic storage device $N_i$, $i \in \{1, \ldots, k\}$,
determining to which subset of data $S_j$ the data block of said device belongs;
retrieving the primary and secondary parity functions stored in the parity storage devices k+1 and k+1+j;
computing the linear function $g_j(a)$ associated with the subset $S_j$;
retrieving the data blocks of the subset $S_j$ except for the block $a_i$; and
reconstructing the content of said systematic storage device $N_i$, $i \in \{1, \ldots, k\}$,
if said device is a parity storage device $N_i$, $i \in \{k+1, \ldots, k+r\}$, determining the index i identifying said storage device;
if the index i is equal to k+1:
retrieving the secondary parity function $f_1(a)$ stored in the parity storage device of index i=k+2 and the data blocks $a_i$ of the subset $S_1$;
computing the linear function $g_1(a)$ associated with the subset $S_1$ and decoding the primary parity function $f_0(a)$; and
reconstructing the content of said parity device of index i=k+1;
if the index i is greater than k+1:
retrieving the primary parity function $f_0(a)$ stored in the parity storage device of index i=k+1 and the data blocks $a_i$ of the subset $S_{i-k+1}$;
computing the linear function $g_{i-k+1}(a)$ associated with the subset $S_{i-k+1}$ and decoding the secondary parity function $f_{1-k+1}(a)$; and
reconstructing the content of said parity device of index i>k+1.

10. The method according to claim 9, wherein the steps of retrieving the parity functions includes transferring data from the corresponding storage devices to a data collecting device.

11. The method according to claim 9, wherein the step of computing the linear function $g_j(a)$, associated with the subset $S_j$ for the reconstruction of a systematic node i such that i∈{1, ..., k}, includes subtracting the primary parity function stored in the storage device $N_{k+1}$ from the secondary parity function stored in the storage device $N_{k+1+j}$.

12. The method according to claim 9, wherein the step of computing the linear function $g_1(a)$, associated with the subset $S_1$ for the reconstruction of a parity node i such that i=k+1, includes generating a linear combination from the data blocks of the subset $S_1$ and from the encoding vector $C_1$, and the step of computing the linear function $g_j(a)$, associated with the subset $S_j$ for the reconstruction of a parity node i such that i∈{k+2, ..., k+r}, includes generating a linear combination from the data blocks of the subset $S_j$ and from the encoding vector $C_j$.

13. The method according to claim 9, wherein the step of reconstructing the content of said systematic storage device includes decoding the data block a from the linear function $g_j(a)$.

14. The method according to claim 9, wherein the step of reconstructing the content of said parity storage device i such that i=k+1 includes decoding the secondary parity function of said parity device of index i=k+1 from the computed linear function $g_1(a)$, and the step of reconstructing the content of said parity storage device i such that i>k+1 includes decoding the secondary parity function of said parity device of index i>k+1 from the computed linear function $g_{i-k+1}(a)$.

15. A device for reconstructing the content of a storage device out of a plurality of devices storing k data blocks $a_i$ in k systematic storage devices $N_i$, i∈{1, ..., k}, and r parity functions $f_j(a)$ in r parity storage devices $N_i$, i∈{k+1, ..., k+r}, said k data blocks and r parity functions being obtained according to a method for coding (k, r) data comprising:
dividing an initial datum a into k data blocks ai of the same size;
grouping the k data blocks into r−1 disconnected subsets Sj of data blocks;
generating, for each subset Sj, a linear function gj(a) defined as a linear combination of the data blocks assigned to said subset Sj; and
generating r parity functions comprising a primary parity function f0(a) as a linear combination of the k data blocks ai, and r−1 secondary parity functions, each secondary parity function fj(a) being defined as the sum of the primary parity function f0(a) and of a linear function gj(a);
the device further comprising means suitable for implementing the steps of the method for reconstructing the content of a storage device according to claim 9.

16. An integrated circuit of ASIC or FPGA type comprising at least one device according to claim 15.

17. An integrated circuit of ASIC or FPGA type comprising at least one device according to claim 15, and at least one device for coding data comprising means suitable for implementing the steps of a method for coding (k, r) data comprising:
dividing an initial datum a into k data blocks ai of the same size;
grouping the k data blocks into r−1 disconnected subsets Sj of data blocks;
generating, for each subset Sj, a linear function gj(a) defined as a linear combination of the data blocks assigned to said subset Sj; and
generating r parity functions comprising a primary parity function f0(a) as a linear combination of the k data blocks ai, and r−1 secondary parity functions, each secondary parity function fj(a) being defined as the sum of the primary parity function f0(a) and of a linear function gj(a).

18. A non-transitory computer program product comprising a program, said program comprising code instructions to perform a method for coding (k, r) data, when executed by at least one computer, comprising:
dividing an initial datum a into k data blocks ai of the same size;
grouping the k data blocks into r−1 disconnected subsets Sj of data blocks;
generating, for each subset Sj, a linear function gj(a) defined as a linear combination of the data blocks assigned to said subset Sj; and
generating r parity functions comprising a primary parity function f0(a) as a linear combination of the k data blocks ai, and r−1 secondary parity functions, each secondary parity function fj(a) being defined as the sum of the primary parity function f0(a) and of a linear function gj(a);
and/or comprising code instructions making it possible to perform the steps of the method according to claim 9 when said program is run on a computer.

19. A method of implementing the content reconstruction method according to claim 9 in a distributed storage system, said distributed storage system comprising a plurality of data storage nodes capable of storing data coded according to a method for coding (k, r) data comprising:
dividing an initial datum a into k data blocks ai of the same size;
grouping the k data blocks into r−1 disconnected subsets Sj of data blocks;
generating, for each subset Sj, a linear function gj(a) defined as a linear combination of the data blocks assigned to said subset Sj; and
generating r parity functions comprising a primary parity function f0(a) as a linear combination of the k data blocks ai, and r−1 secondary parity functions, each secondary parity function fj(a) being defined as the sum of the primary parity function f0(a) and of a linear function gj(a).

20. A method of implementing the content reconstruction method according to claim 9 in a local storage system, said local storage system comprising data storage discs capable of storing data coded according to a method for coding (k, r) data comprising:
dividing an initial datum a into k data blocks ai of the same size;
grouping the k data blocks into r−1 disconnected subsets Sj of data blocks;
generating, for each subset Sj, a linear function gj(a) defined as a linear combination of the data blocks assigned to said subset Sj; and
generating r parity functions comprising a primary parity function f0(a) as a linear combination of the k data blocks ai, and r−1 secondary parity functions, each secondary parity function fj(a) being defined as the sum of the primary parity function f0(a) and of a linear function gj(a).

* * * * *

UNITED STATES PATENT AND TRADEMARK OFFICE
CERTIFICATE OF CORRECTION

| | |
|---|---|
| PATENT NO. | : 11,914,475 B2 |
| APPLICATION NO. | : 17/045980 |
| DATED | : February 27, 2024 |
| INVENTOR(S) | : Hana Baccouch et al. |

It is certified that error appears in the above-identified patent and that said Letters Patent is hereby corrected as shown below:

In the Claims

In Claim 1, Column 17, Line 34, "blocks a of a same size;" should be -- blocks $a_i$ of a same size; --.

In Claim 3, Column 17, Line 66, "the data block a belongs" should be -- the data block $a_i$ belongs --.

In Claim 13, Column 19, Line 17, "the data block a from" should be -- the data block $a_i$ from --.

Signed and Sealed this
Sixteenth Day of April, 2024

Katherine Kelly Vidal
*Director of the United States Patent and Trademark Office*